United States Patent
Parthier et al.

(10) Patent No.: US 7,303,627 B2
(45) Date of Patent: *Dec. 4, 2007

(54) METHOD FOR MAKING LOW-STRESS LARGE-VOLUME NOT-(111)-ORIENTED CRYSTALS WITH REDUCED STRESS BIREFRINGENCE AND MORE UNIFORM REFRACTIVE INDEX AND CRYSTALS MADE THEREBY

(75) Inventors: Lutz Parthier, Kleinmachnow (DE); Joerg Staeblein, Jena (DE); Gunther Wehrhan, Jena (DE); Christian Kusch, Jena (DE)

(73) Assignee: Schott AG, Mainz (DE)

( * ) Notice: Subject to any disclaimer, the term of this patent is extended or adjusted under 35 U.S.C. 154(b) by 114 days.

This patent is subject to a terminal disclaimer.

(21) Appl. No.: 11/062,711

(22) Filed: Feb. 22, 2005

(65) Prior Publication Data

US 2005/0204998 A1    Sep. 22, 2005

(30) Foreign Application Priority Data

Feb. 23, 2004   (DE) ............. 10 2004 008 754

(51) Int. Cl.
*C30B 25/12* (2006.01)
(52) U.S. Cl. .................. 117/4; 117/2; 117/3
(58) Field of Classification Search ......... 117/2, 117/3, 4
See application file for complete search history.

(56) References Cited

U.S. PATENT DOCUMENTS 6,332,922 B1   12/2001   Sakuma et al.

| | | |
|---|---|---|
| 2003/0089306 A1 | 5/2003 | Speit et al. |
| 2003/0089307 A1 | 5/2003 | Wehrhan et al. |
| 2004/0005266 A1 | 1/2004 | Sakuma et al. |
| 2004/0016743 A1 | 1/2004 | Motakef et al. |
| 2004/0099205 A1 | 5/2004 | Li et al. |
| 2004/0251851 A1 | 12/2004 | Maishima |

FOREIGN PATENT DOCUMENTS

| | | |
|---|---|---|
| DE | 213 514 | 9/1984 |
| DE | 100 10 484 | 9/2001 |
| DE | 100 10 485 | 9/2001 |
| EP | 0 939 147 A2 | 9/1999 |
| EP | 0 942 297 A2 | 9/1999 |
| EP | 0 972 863 | 1/2000 |
| JP | 10-251096 | 9/1998 |
| JP | 2001-335398 | 12/2001 |
| JP | 2003-327499 | 11/2003 |

OTHER PUBLICATIONS

John H. Burnett et al: "Intrinsic Birefringence in Calcium Fluoride . . . ", Physical Review B, vol. 64, 2001, 241102-1-241102-4.

*Primary Examiner*—Felisa Hiteshew
(74) *Attorney, Agent, or Firm*—Michael J. Striker

(57) ABSTRACT

A method is described for making an especially not-(111)-oriented low-stress large-volume crystal having a glide plane with reduced stress birefringence and more uniform refractive index. The method includes growing and tempering the crystal while heating and/or cooling to form a temperature gradient in order to relax stresses arising along the glide plane. During the tempering the heating and/or cooling occurs by heat transfer in a heat transfer direction and the heat transfer direction or temperature gradient is oriented at an angle of from 5° to 90° to the glide plane. Crystals with a uniform refractive index with variations of less than $0.025 \times 10^{-6}$ (RMS value) are produced by the method.

10 Claims, No Drawings

METHOD FOR MAKING LOW-STRESS LARGE-VOLUME NOT-(111)-ORIENTED CRYSTALS WITH REDUCED STRESS BIREFRINGENCE AND MORE UNIFORM REFRACTIVE INDEX AND CRYSTALS MADE THEREBY

The invention described and claimed hereinbelow is also described in DE 10 2004 008 754.7, filed Feb. 23, 2004. This German Patent Application, whose subject matter is incorporated here by reference, provides the basis for a claim of priority of invention under 35 U.S.C. 119 (a)-(d).

BACKGROUND OF THE INVENTION

1. Field of the Invention

The present invention relates to methods of making low-stress, large-volume not-(111)-oriented crystals, which have reduced birefringence over their volume and a uniform index of refraction, by means of a specially directed tempering. The invention also relates to the not-(111)-oriented crystals made by the method, to optical elements made from the crystals and generally to uses of the crystals made by the method.

2. Related Art

There is an ever-increasing need for crystals, especially single crystals, for lenses and optical systems, also for wavelengths outside of the visible range. For example, lasers generating laser beams at wavelengths in the far UV range (DUV), especially at wavelengths below 250 nm, especially at 248 nm, 193 nm and/or 157 nm, are used in methods of making computer chips by means of microlithography. Large-sized single crystals are used as optical elements and/or lenses in illuminating and imaging optics at 193 nm and preferably at 157 nm. $CaF_2$ has been used as a preferred material for this purpose. Optics for manufacture of integrated circuits, e.g. computer chips, must have the smallest possible structural defects, i.e. sharp imaging, in order to obtain a perfect product. In order to attain the required image quality, very high specifications are established for the optical base material, i.e. the crystal. Thus the index of refraction n must be as uniform as possible, i.e. its variation in the lens blank should not be more than $1*10^{-6}$, and the stress birefringence should be definitely under 1 nm/cm.

A number of methods for making large-volume single crystals are known in the art. For example DE-A 100 10 484 describes an apparatus for growing large-volume single crystals. This reference also describes a method for tempering this sort of crystal to reduce the stress birefringence. In this method usually the method starts with crystals with an average stress birefringence (RMS value) of about 5 to 20 nm/cm prior to tempering. The described method may reduce the stress birefringence in the crystals to 1 nm/cm and reduces the refractive index variations so that the refractive index does not vary by more than $\Delta n = 5*10^{-6}$ within the crystal. After being grown the crystal is placed in a tempering oven and heated for at least two hours above 1150° C. in the presence of a $CaF_2$ powder reducing the evaporation from the crystal. Also a tempering process is described in DD-PS 213,514, in which a $CaF_2$ crystal is heated in a $PbF_2$ containing atmosphere at a temperature of 1200° C. In this tempering process stress birefringence of 10 to 25 nm/cm (RMS value), which is present in the crystal, is reduced to only 1 nm/cm by heating for 2 to 3 hours at 1200° C.

In JP-A 2001-335 398 a tempering method for reducing stress birefringence and including uniformity of refractive index is described, in which the crystal is first heated in a range from 1020 to 1150° C. for a predetermined time and is cooled with a cooling rate of 1° C. per hour, then to a temperature under 700° C.

During tempering a nearly complete elimination of the stresses present in the crystal occurs by a plastic deformation of the crystal lattice by activation of glide processes along a glide system predetermined by the respective structure of the crystal lattice and by atomic diffusion mechanisms (cascade processes). Thus it is necessary that the tempering or annealing temperature is as high as possible, in order to obtain a crystal in which the defects are minimized throughout its entire crystalline volume. Generally the higher the temperature, the less the residual stress. However the crystal must be given sufficient time for the desired glide and diffusion processes to occur. During the entire tempering process comprising the heat-up stage, the holding stage when the temperature is held at a maximum value and the cooling stage, an extremely uniform temperature distribution must be guaranteed throughout the entire crystal volume. The spatial temperature distribution throughout the entire crystal volume results from an overlap of a static temperature gradient (apparatus-dependent temperature distribution) with a dynamic temperature gradient, which arises because of the heating up and cooling down of the crystal. The former gradients dominates the holding time, the latter comes into play during the heat up and cool down of the crystal.

Based on those considerations currently the orientation of the crystal in the temperature field is considered irrelevant for the tempering results, since the volume at the maximum temperature (holding temperature) is essentially in a more uniform static temperature field than that in the heat up stage or the cooling down stage.

In order to keep the crystal structure produced by the tempering more or less stress-free, it is cooled in such manner that no temperature gradient, which produces new stresses in the crystal, is produced.

The tempering can be performed as a process step in the crystal growing apparatus or as a separate process in a special oven.

Crystals with the smallest possible dimensions must be tempered based on theoretical considerations regarding the relationships between the dimensions of the crystal body, such as diameter and thickness, and the stresses producing the stress birefringence occurring in the material. Since the temperature differences $\Delta T$ generating stress, which are produced by heating and/or cooling between different locations in the crystal, are proportional to the square of the thickness and/or height, h, of the crystal and the square of the diameter, d, of the crystal disk, i.e. $\Delta T \sim d^2$ and $\Delta T \sim h^2$, crystals with the smallest possible volume are to be tempered. An increase in the diameter and/or the height or thickness of the crystal body during tempering causes an increase in the stress birefringence, other conditions being equal.

In JP-A 10-251 096 a procedure is described in which the crystal is first cut to the dimensions of the final product and subsequently a tempering process is performed.

Typical procedures for tempering calcium fluoride were already described in EP 0 939 147 A2 or in U.S. Pat. No. 6,332,922 B1. Especially special temperature and time conditions are described for improving the stress birefringence and index of refraction uniformity of calcium fluoride crystals. The described methods however do not provide crystals, which have the required quality to fulfill the actual specifications for microlithography with wavelengths of 193 nm and/or 157 nm, which have developed in the meantime.

The stress optical tensor gives the connection between the mechanical variables (such as stress) and the optical effects caused by them (such as the stress birefringence SDB) in crystals (direction-dependent). That means that stresses of equal magnitude in single crystal material can lead to clearly different stress birefringence and non-uniformities in the index of refraction depending on the crystallographic orientation and/or the observation direction. For these reasons up to now components were used, in which the minimal stress birefringence is obtained in the application or use direction. For calcium fluoride crystals that direction is the (111) direction. Thus currently materials for lens blanks are used exclusively in the (111) orientation (and/or near the (111) direction for cubes).

The experiments of J. H. Burnett, Z. H. Levine, E. L. Shirley, described in "Intrinsic birefringence in calcium fluoride and barium fluoride", Physical Rev. B 64 (2001), 241102 have shown that calcium fluoride has an intrinsic birefringence. This effect strongly increases near the band edge of the material and leads to pronounced imaging errors using application wavelengths of 157 nm. In order to compensate for the intrinsic birefringence, lenses of different crystal orientation are combined by the objective manufacturer. Furthermore the lens blanks, rectangular prisms and prisms in general must be made in different crystal orientations, particularly in the (100)-orientation and (110) orientation.

The specifications for the not-(111)-oriented products regarding the optical quality, particularly the index of refraction uniformity and the stress birefringence, are comparable with the specifications, which are required of (111)-material. Generally these specifications regarding the quality for not-(111)-oriented products are not equally difficult to attain. The residual stresses in material for (100) products and/or (110)-oriented products are generally about 80 to 90% less than for (111)-oriented products, in order to attain the same stress double refraction or birefringence.

The (111)-orientation is preferred for blanks or semi-finished articles based on the anisotropy of the optical stress properties according to the disclosures in EP 0 942 297 A2. The (111), (100) and (110) orientations were tested. It was found that only the (111)-disk had stress birefringence values approximately in the required range when $CaF_2$ disks having the different orientations were tested under the same heat treatment conditions.

For $BaF_2$ disks it was shown that the attained reduction of the stress birefringence for the (111)-disk was substantially greater than that for the not-(111)-oriented disks.

As is the case with $CaF_2$ the required quality cannot currently be attained with an optical principle direction that is different from (111).

SUMMARY OF THE INVENTION

It is an object of the present invention to make crystals having an optical principle direction different from (111), especially a (100) or (110) principle direction, with an optical quality, which meet the current requirements of microlithography at wavelengths of 193 nm or shorter, by tempering at elevated temperatures in a suitable oven and/or an apparatus suitable for tempering.

This object is achieved by the method defined in the appended claims.

According to the invention it was found that improvements can be made in the optical properties of this sort of crystal when an especially small radial temperature gradient is provided in a tempering oven during tempering, which deviates or differs by an angle of at least 5° from the glide plane of the tempered material placed in the tempering oven.

Also the axial temperature gradient in the tempering oven must be adjusted so as to be as small as possible.

The direction of the maximum temperature gradient is at the same time the direction of the highest stresses. Since the crystal experiences a plastic deformation only along a definite glide direction on a definite glide plane only the stress acting to deform the crystals in this glide system is relevant for the deformation.

In the case of $CaF_2$ the principle glide plane is the (100) plane. If the maximum temperature gradient occurs parallel to and/or perpendicular to the surface of the 100-disk, the stresses are completely effective in the glide system. By tilting the disk orientation the effective stresses are reduced. In the case of the 111-orientation (the angle between the 111-surface and the 100-glide plane amounts to 54.73°) these effective stress components are clearly reduced. The best conceivable case in this sense would be a (110) orientation. In this case however the second (auxiliary)-glide system with 110 as glide plane would be extremely well oriented and activated.

The angle between the glide direction and the direction of maximum temperature gradient is preferably greater than 5°, especially greater than 10°, i.e. 5° to 85°, especially 10° to 80°. For $CaF_2$ crystals and structures comparable to them angles of from 25° to 36° are especially preferred. In other crystal systems also larger angles can be attained. According to the teaching of the present invention it is preferable to adjust the angle between the glide direction and the direction of the temperature gradient so that it is as large as possible.

In an especially preferred embodiment the crystal is tempered in its (111)-orientation and of course so that its (111)-axis is parallel to the axis of the tempering oven that is use. Thus it is preferred that the radial temperature gradient produced in the tempering oven is directed parallel to the earth's surface, i.e. perpendicular to the direction in which gravity acts.

The extreme requirements for freedom from stress in the crystal are especially fulfilled when the static temperature gradients in the apparatus are reduced as well as the dynamic temperature gradients. The static temperature gradients are caused by the spatial temperature distribution (oven design) in the tempering oven. They occur during the holding time interval.

Dynamic temperatures gradients occur in the tempered material, when heat from the outside (oven) is supplied or removed. Heat transport depends on temperature gradients in the material. The magnitudes of these gradients are essentially determined by heat up and cool down speed. These gradients are described here as "dynamic temperature gradients".

These types of gradients are superimposed on each other during the heat up and cool down stages.

It is required that the heat supplied from the exterior to the crystal during the tempering according to the invention produces a not-too-large small temperature gradient during heating up of the crystal. According to the invention it has proven to be suitable to limit the radial and axial dynamic temperature gradients formed during heating by the heating rate so that a temperature difference of no more than 5° C., measured at the same time, exists between any two places in the crystal. Preferably the upper limit of the temperature difference between points in the crystal is 2° C. at maximum, but a maximum difference of 1° C. is particularly preferred. To obtain these small temperature differences the heat up rates should be less than 18 K/h, preferably less than 12 K/h and especially preferably less than 10 K/h. According to the invention it has also been found that small heating rates are essential in order to obtain good tempering results. It has been shown that defects generated during the heating in the case of crystals not arranged in a (111)-orientation perpendicular to the earth's surface, i.e. parallel to the direction in which gravity acts, substantially interfere with the end result and are substantially more difficult to relax (during the holding time).

It is also preferable that these maximum temperature differences do not occur in an interior volume region of the crystal, i.e. in a region which is spaced by at least 10% of the crystal diameter from the crystal edge. Although it is not preferred, slightly higher temperature differences can be present in the edge region than in the foregoing region.

After the heat up, i.e. during the holding time at the maximum tempering temperature static temperature gradients in the radial or axial direction form in the tempering chamber or space. These gradients are limited to a maximum of 0.2 K/cm by the oven configuration according to the invention. Preferably however static radial temperature gradients in the tempering space of less than 0.013 K/cm and static axial temperature gradients in the tempering space of less than 0.07 K/cm are guaranteed.

In a preferred embodiment of the invention the crystal is covered by a graphite member. The graphite member preferably comprises graphite mats or graphite plates. Graphite plates assist in reducing the temperature gradients in the tempered material, since uniform heat transfer occurs to and from the crystal. The graphite covers have good heat conductivity. It is preferable to perform the tempering by means of heating elements or sources arrange laterally in the oven so that the resulting gradients in the crystal are lateral, i.e. parallel to the earth's surface. However it is also possible to perform the heating during tempering by means of cover and bottom heaters; in this latter type of heating it has proven to be appropriate to put especially good heat conducting graphite plates on the crystal.

It has proven suitable to first heat to a temperature of 350° C. to 600° C., especially 350° C. to 500° C., during tempering, in order to remove residual moisture from the surface of the calcium fluoride crystal and water introduced during storage. A heating of 350° C. to 400° C. is especially preferred. This preferably happens under vacuum. The water drying time usually amounts to from 12 to 45 hours, preferably 24 hours.

It has been shown that the crystal defects in $CaF_2$ may be further reduced sufficiently to reach the above-described goals, when the crystal is heated to a temperature above 1000° C. and is held at the set temperature for at least 65 hours, preferably at least 75 hours. However 80 hours is especially preferred. According to the invention it was found that a clearly extended time interval is required compared to currently known processes opposite to the current ideas, in order to permit the required relaxation process to run in the crystal.

The set holding temperature during tempering amounts according to the invention to at least 1000° C., preferably at least 1050° C., wherein at least 1080° C. and/or 1100° C. are especially preferred. A tempering above 1200° C. is particularly preferred, tempering over 1210° C. is even more particularly preferred. The upper temperature limit during tempering should not exceed 1415° C., preferably 1370° C. An upper temperature limiting value of at most 1360° C. is preferred, but a value of 1350° C. is particular preferred. Suitable upper temperature limits during tempering amount to at most 1300° C., but a maximum temperature of 1250° C. and/or 1200° C. is sufficient in most cases. According to the invention it has also proven advantageous that there are no or only minimal temperature differences from place to place in the crystal during the holding time interval, i.e. the temperature is kept as uniform as possible through the entire crystal volume during the holding stage.

During the heat up stage heating rates are set less than 18 K/h according to the invention, preferably less than 12 K/h, but heating rates of less than 10 K/h are especially preferred. According to the invention it has now been found that small heating rates are essential in order to achieve good tempering results. It has been shown namely that during the heat up defects generated in the case of blanks that are not (111)-oriented are essentially more troublesome in the final product and are also essentially more difficult to relax (during the holding time).

The relaxation processes occurring during the holding time with the very small static temperature gradients may be unsuccessful if the cooling is too rapid. The cooling must be sufficiently slow so that the static temperature gradients present during the holding time do not essentially deteriorate. If the temperature is measured within the tempering vessel at different locations and also different times during the cooling process, the gradients characterized as dynamic temperature gradients may be only insignificantly poorer than during the holding time. According to the invention cooling rates are maintained, which amount to less than 0.5 K/h, preferably less than 0.4 K/h, and especially preferably less than 0.3 K/h, in the upper temperature range of the cooling stage and can be increased in a lower temperature range of the cooling stage.

The increase of the cooling rates in the lower temperature range is desirable and also possible, in order to not unnecessarily increase the processing time and associated costs. The increase of the cooling rate can occur in a single step, but preferably occurs in several steps. The temperature rates in the lower temperature range may not be increased over 3 K/h, preferably not over 2 K/h, and especially preferably not over 1.7 K/h, according to the invention.

The limiting temperature that separates the upper from the lower temperature range of the cooling stage is in a range between 900° C. and 600° C. The higher the quality requirements for the product, the lower the transition temperature.

The apparatus should preferably be made exclusively from highly pure graphite in its interior, in order to prevent contamination of the $CaF_2$ crystals, which can lead to a reduction of transmission.

The purity requirements likewise extend to the products to be tempered. Thus prior to coating the apparatus the parts are subjected to a careful purification. The parts should be both fat-free and dust-free, and have no surface moisture or as little surface moisture as possible. A purification of the parts with fat-dissolving organic solvent at high vapor pressure is preferred. After a successful purification contact with the parts with bare skin or dirty objects is to be avoided.

It has also proven to be appropriate to perform tempering under a protective gas. The conventional protective gases are nitrogen, helium, argon and/or xenon.

At least one scavenger material is preferably used to remove the residual oxygen present in the apparatus, on the crystal surfaces and/or in the crystal lattice. Compounds, such as $ZnF_2$, $PbF_2$, $XeF_2$ and $SnF_2$, which are used as solids, have proven to be suitable. It is also possible to use a gaseous scavenger after a drying stage. Especially fluorine gas, fluorine gas/inert gas mixture, fluorocarbon gases and/ or fluoro-hydrocarbon gas are preferable for use as gaseous scavengers. A combination of solid and gaseous scavengers can also be used.

In a preferred embodiment the tempering is performed using a gaseous scavenger, and indeed in a fluorine-containing atmosphere. For example, $CF_4$, $C_2F_6$, $C_3F_8$ or $CHF_3$, $SF_6$ or $NF_3$ are preferred for use with fluorocarbon gases, which are mixed in a concentration of 1 to 50%, especially 5 to 30%, and more preferably 5 to 15%, with an inert gas to form a preferred scavenger gas in the apparatus. For this purpose fluorine gas is conducted into a tempering oven or a tempering vessel containing the tempering material and/or released by vaporization. Additional reactive fluorine gases include tetrafluoromethane and other fluorocarbon materials or fluoro-hydrocarbons. Surprisingly the transmission of the $CaF_2$ is increased by the use of these gases. This effect is not achieved using inert gas, vacuum or powdery scavenger material.

In an especially preferred embodiment the fluorine-containing atmosphere is an HF atmosphere. In another preferred embodiment according to the invention the fluorine-containing atmosphere is used together with a protective gas. The gas mixture arising thereby appropriately contains from 0.1 to 20% fluorine gas, especially from 1 to 10%. An especially preferred mixture is a mixture of HF and $N_2$.

In an entirely preferred embodiment the fluorine-containing atmosphere is provided a fluorine-releasing solid body, such as $XeF_2$. $XeF_2$ is a solid at room temperature, which decomposes at temperatures above 400° C. to Xe and $F_2$ gas. It is appropriate to use $XeF_2$ enclosed in an airtight TEFLON® bag.

It has also proven to be appropriate that the tempering is performed in a reducing atmosphere. A reducing atmosphere, for example, is obtained by addition of graphite powder, which reacts with water to form $CO/CO_2$ and $CH_4$. $CH_4$ itself has a reducing effective. Also the partially gaseous lead fluoride has a reducing oxygen-removing effect against calcium oxide. In this way calcium oxide present in calcium fluoride crystals or arising by reaction with water can be converted to calcium fluoride, which serves for deposit formation and also reduction of small angle grain boundaries.

In an especial preferred embodiment a gas mixture for temperature with the above-described composition may flow through the apparatus with a flow rate of a few liters per minute during the tempering stage.

Special care regarding purity and freedom from oxygen of all materials and surfaces found in the apparatus can be left to the scavenger material. First drying is performed in a high vacuum in order to completely remove surface water and oxygen. The tempering can occur in vacuum, but also in an inert gas atmosphere.

It has also proven suitable to maintain a calcium fluoride partial pressure of 0.7 to 1.5 mbar, especially 0.8 to 1 mbar, in the tempering vessel containing the tempering material. This is preferably achieved by addition of $CaF_2$ powder as the tempering powder. The tempering vessel, which is usually built into a suitably evacuated tempering oven, is preferably formed so that it is not gas-tight. The transport of gases from the interior of the tempering vessel is only hindered, but not prevented. The extent of the hindering of the transport of gas is arranged so that the water removed from the surface of the tempering material and/or the tempering vessel and/or the gas removed can escape sufficiently into the space outside of the tempering vessel during a drying phase with temperatures between 350° C. to 600° C., preferably from 350° C. to 500° C. and especially preferably from 350° C. to 400° C. The same goes for the conduction and transport of protective gas and/or gaseous scavenger material. In the upper temperature range (higher than 600° C.) the form of the tempering vessel should guarantee that the above-described partial pressure of $CaF_2$ is maintained and, in the case of a solid scavenger, that the scavenger partial pressure determined by the type of scavenger, the temperature range and the given amount of scavenger is maintained. A quasi-stationary state exists over the wide temperature range for the defined material because of that, as long as sufficient tempering powder, scavenger powder and/or protective and/or fluorine gas is present.

Preferably a finely divided calcium fluoride powder with an average grain size of 100 nm to 1 mm is used during tempering. Typical average grain sizes amount to 1 to 200 µm, preferably 5 to 100 µm, and especially 10 to 50 µm. The surface area of the finely divided calcium fluoride powder should be at least 10 times, preferably at least 100 times, the surface area of the material to be tempered. In an especially preferred embodiment the powder has at least a thousand times, in many cases at least 5,000 times and even 10,000 times, the surface area of the tempering material.

It is particularly preferred to embed the crystals to be tempered and the finished optics directly in the tempering powder, so that they have direct contact with the powder. It has proven appropriate to remove sufficiently troubling impurities in this way.

The calcium fluoride powder preferably contains at least one scavenger for removing oxygen present in the crystal structure. Preferred scavengers include $PbF_2$, $ZnF_2$, $SnF_2$, graphite and other low melting fluorides and/or fluoride compounds, which react into volatile compounds with oxygen. $XeF_2$ is an additional preferred scavenger, which is solid at room temperature, however decomposes on heating to form Xe gas and $F_2$ gas and thus acts as a low temperature scavenger. The preferred grain sizes of the scavenger correspond to that of the $CaF_2$ powder, however they can differ from that of the $CaF_2$ powder.

In an especially preferred embodiment the powder used for tempering contains finely divided hydrocarbons, especially graphite.

Preferably the heat supply occurs laterally to the crystal being tempered and independently of the length of the diffusion path and independently of the ratio of diameter to height. Principally the heat supply can occur also through the upper and lower surface of the crystalline body. In a further preferred embodiment the surface, through which the heat is supplied, and/or the surface, through which no heat is supplied, is covered. Preferred covers are graphite mats or graphite plates.

The crystal materials within the scope of the present invention include all alkali fluorides and alkaline earth fluorides, such as $CaF_2$, $BaF_2$, $SrF_2$, $MgF_2$ as well as NaF, LiF and KF. Also crystals of mixed fluorides, such as mixed crystals of $CaF_2$ and $SrF_2$, are suitable according to the invention.

In a preferred embodiment of the invention the entire crystal or an oriented blank cut out of a raw crystal, which is substantially oversized in comparison to that of the prior art, is tempered. The tempering occurs in an oven and/or other apparatus suitable for this purpose, which provides a static temperature gradient according to the invention and dynamic temperature gradients. The excess crystalline material is then removed after tempering. Preferably the excessive height and diameter is reduced by removing excess material along the periphery and/or outer edges from the crystal center portion. In a preferred embodiment the increase of the oversized dimensions in relation to the final dimensions of the crystal amounts to at least 5%, preferably 10%, of the final dimensions. An increase in dimensions of 15%, and especially of 20%, is even more preferable. An increase of +25 or +30% is most preferred. The increase in dimensions preferably relates to the diameter and/or height of the crystal. For example, should the final dimension of the finished crystal be 20 cm, the crystal that is tempered should have a 20% increase in this dimension, e.g. it should have a diameter of at least 24 cm. The later tempering of the crystal after removal of the edge regions, which produces interior elastic residual stress in the crystal, should not take place.

RMS values of refractive index uniformity of better than $0.025 \times 10^{-6}$, especially better than $0.015 \times 10^{-6}$, can be obtained in $CaF_2$ crystals by the procedure according to the invention. Values of the stress birefringence (SDB) in nm/cm for these $CaF_2$ crystals are listed in the following Table I.

TABLE I

STRESS BIREFRINGENCE (in nm/cm) VERSUS ORIENTATION

|   | <111>-orientation, good | <111>-orientation, special | <100> or <110>-orientation, good | <100> or <110>-orientation, special |
|---|---|---|---|---|
| SDB-PV value | 0.5 | 0.2 | 2.5 | 1 |
| SDB-RMS value | 0.15 | 0.08 | 1 | 0.35 |

The method according to the invention is suitable for making crystals of all shapes and all orientations. Thus, for example, without more it is possible to obtain crystals in the (100)- or (110)-orientation instead of in the (111)-orientation, which are approximately stress-free, which was not possible up to now with the prior art methods.

The crystals according to the invention can be made by known procedures according to the so-called gradient solidification methods (gradient solidification methods GSM). Further conventional known processes for making them on an industrial scale include, for example, the Bridgman-Stockbarger method, the Vertical-Gradient-Freeze method, the Neck-Kyropoulos method and the Czochralski method, as well as variants of these methods. In these methods polycrystalline material is melted in a vessel or crucible and subsequently the melt is slowly allowed to solidify in a directed manner, preferably by means of a seed crystal. Subsequently slow cooling takes place in all these methods in order to obtain crystals with already small thermal stresses. All the crystals obtained in these processes are suitable for the method according to the invention.

The invention not only concerns a method, but also the stress-poor crystals, which have a very uniform index of refraction, made by the method. The crystals according to the invention have the above-described properties, especially optical properties.

The invention also relates of the use of the crystals obtained by the method for optical purposes, especially as blanks and/or half-finished articles for optical elements. Microlithography, usually microlithography at <250 nm, especially at 248 nm and/or at 193 nm and preferably at 157 nm, is a preferred application of the crystals obtained by the method according to the invention.

The optical elements obtained according to the invention especially include prisms and lenses, which are used in optical devices, especially objectives. When they are used in microlithography and photography, generally steppers, excimer lasers, wafers and computer chips are made with them, as well as integrated circuits and electronic devices, which should contain those circuits and electronic devices.

The following example is illustrative of the method according to the invention, but should not be considered to limit the appended claims.

EXAMPLE

A single disk with a (100) orientation and a larger crystalline cylinder in an approximate (111) orientation were tempered in a tempering process. The holding time amounted to 100 h at 1115° C. in this tempering process. After that a cooling process to 730° C. took place at a cooling rate less than 0.3 K/h and finally to room temperature with a rate of 0.85 K/h. Subsequently a (100)-disk was cut from the crystal volume with geometry comparable to the single disk. The stress birefringence of both disks was measured. The single (100)-disk had a stress birefringence (SDB) equal to 3.2 nm/cm (PV value). The disk, which was cut out of the volume after tempering, had a stress birefringence of 0.87 nm/cm (PV value).

Application describes the invention described hereinabove and claimed in the claims appended hereinbelow and provides the basis for a claim of priority for the instant invention under 35 U.S.C. 119.

While the invention has been illustrated and described as embodied in a method for making large-volume not-(111)-oriented crystals with reduced stress birefringence and more uniform refractive index and crystals made thereby, it is not intended to be limited to the details shown, since various modifications and changes may be made without departing in any way from the spirit of the present invention.

Without further analysis, the foregoing will so fully reveal the gist of the prevent invention that others can by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method of making a low-stress large-volume crystal that has an orientation that is not a (111)-orientation, having a glide plane with a reduced stress birefringence and more uniform refractive index, said method comprising growing and tempering the crystal while heating and/or cooling while forming a temperature gradient in order to relax stresses arising along the glide plane;
   wherein during the tempering said heating and/or said cooling occurs by heat transfer in a heat transfer direction, and
   wherein said heat transfer direction or the temperature gradient is oriented at an angle of greater than 5° to the glide plane.

2. The method as defined in claim 1, wherein the angle between the glide plane and the temperature gradient is between 25° to 65°.

3. The method as defined in claim 1, wherein the angle between the glide plane and the temperature gradient is between 35° to 55°.

4. The method as defined in claim 1, wherein the crystal is a calcium fluoride crystal and during the tempering of the calcium fluoride crystal said angle between said glide plane and said temperature gradient is greater than 25°.

5. The method as defined in claim 1, wherein the tempering of the crystal takes place in a tempering oven and during the tempering the crystal is oriented in the tempering oven so that a (111)-direction of the crystal is parallel to a direction in which gravity acts.

6. The method as defined in claim 1, wherein the heat transfer occurs laterally.

7. The method as defined in claim 1, wherein the crystal is a calcium fluoride crystal, the tempering of the crystal takes place in a tempering oven and during the tempering of the calcium fluoride crystal the crystal is oriented so that a (111)-direction of the crystal is parallel to an axis of the temperature field in the tempering oven.

8. The method as defined in claim 1, wherein the crystal is a calcium fluoride crystal and the tempering takes place so as to form a blank in a predetermined 100- or 110-orientation.

9. The method as defined in claim 1, wherein the tempering is performed in a tempering chamber with a temperature field, which has a statistical radial temperature gradient of less than 0.013 K/cm and/or an axial statistical temperature gradient of less than 0.07 K/cm.

10. The method as defined in claim 1, wherein no further tempering occurs after the tempering and cooling of outer edge regions of the crystal to a predetermined extent.

* * * * *